United States Patent [19]
Oyama

[11] Patent Number: 6,013,552
[45] Date of Patent: Jan. 11, 2000

[54] METHOD OF MANUFACTURING A SPLIT-GATE FLASH MEMORY CELL

[75] Inventor: Kenichi Oyama, Tokyo, Japan

[73] Assignee: NEC Corporation, Tokyo, Japan

[21] Appl. No.: 09/090,227

[22] Filed: Jun. 4, 1998

[30] Foreign Application Priority Data

Jun. 4, 1997 [JP] Japan .................................. 9-146784

[51] Int. Cl.⁷ .......................... H01L 21/301; H01L 21/46; H01L 21/78
[52] U.S. Cl. ............................................ 438/264; 438/266
[58] Field of Search .................................. 257/316, 315, 257/314; 438/264, 257, 262, 266, 304

[56] References Cited

U.S. PATENT DOCUMENTS

| | | | |
|---|---|---|---|
| 5,138,573 | 8/1992 | Jeuch | 257/316 |
| 5,268,585 | 12/1993 | Yamauchi | 257/316 |
| 5,880,499 | 3/1999 | Oyama | 257/316 |

FOREIGN PATENT DOCUMENTS

| | | |
|---|---|---|
| 6-163923 | 6/1994 | Japan . |
| 8-139210 | 5/1996 | Japan . |
| 8-293566 | 11/1996 | Japan . |

*Primary Examiner*—B Dutton
*Attorney, Agent, or Firm*—Foley & Lardner

[57] ABSTRACT

In a method of manufacturing a split-gate flash memory cell including source and drain diffusion regions (6 and 9), a floating gate insulation film (2), a floating gate electrode (3), a control gate insulation film (4), and a control gate electrode (10), the method includes the steps of: successively forming the floating gate insulation film (2) and the floating gate electrode (3) on a selected area of a semiconductor substrate (1); forming the control gate insulation film (4) on the floating gate electrode (3) and on a remaining area of the semiconductor substrate (1), the control gate insulation film (4) having a side wall part brought into contact with a side wall of the floating gate electrode (3); carrying out ion-implantation of a first dopant to form the source diffusion region (6) on a first part of the remaining area of the semiconductor substrate (1); forming a sidewall electrode (8) brought into contact with the sidewall part of the control gate insulation film (4); carrying out ion-implantation of a second dopant to form, on a second part of the remaining area of the semiconductor substrate (1), the drain diffusion region (9) self-aligned with respect to the sidewall electrode (8); and forming the control gate electrode (10) on the control gate insulation film (4) and on the sidewall electrode (8).

12 Claims, 2 Drawing Sheets

METHOD OF MANUFACTURING A SPLIT-GATE FLASH MEMORY CELL

BACKGROUND OF THE INVENTION

This invention relates to a method of manufacturing a split-gate flash memory cell of a nonvolatile semiconductor memory.

As a nonvolatile semiconductor memory, an EPROM (Erasable Programmable Read Only Memory) and a flash memory which are capable of erasing and writing information or data are known. Such a nonvolatile semiconductor memory is manufactured in the following manner. On a silicon substrate, a gate oxide film, a floating gate electrode layer for accumulating electrons, an interelectrode insulation film, and a control gate electrode layer to form a word line for each memory cell are deposited and patterned to form a gate electrode of a layered structure which comprises a floating gate and a control gate stacked thereon. Then, a source and drain diffusion layers and a channel region are formed. Thereafter, a metal wiring pattern leading to each electrode is formed.

In case of the flash memory in which each memory cell has the gate electrode of a layered structure comprising the floating gate and the control gate stacked thereon, there is a problem of overerasure upon erasing the data. Specifically, in order to erase the data in the flash memory, the electrons accumulated in the floating gate are removed simultaneously in several thousands or more memory cells. In this event, the amount of the electrons removed from the floating gate fluctuates among individual memory cells. As a result, a threshold voltage fluctuates among the individual memory cells over a variation range on the order of 1V.

In view of the above, the erasure of the data in the flash memory is generally carried out so that the threshold voltage is low. However, if the threshold voltage fluctuates, a particular memory cell may exhibit a depletion transistor characteristic such that the threshold voltage is not greater than 0V. In presence of the particular memory cell exhibiting such a depletion transistor characteristic, electric current continuously flows through a particular bit line connected to the particular memory cell even if the particular memory cell is not read. This makes it impossible to read the data in other memory cells connected to the particular bit line.

In order to eliminate the above-mentioned disadvantage, proposal is made of a split-gate memory cell having a split-gate structure. The split-gate memory cell is different from a memory cell having a gate electrode of an ordinary layered structure in that only a part of the channel region is covered with the floating gate electrode while the remaining part of the channel region is covered with the control gate electrode. Even if the electrons in the floating gate electrode are excessively removed so that the threshold voltage directly under the floating gate electrode is not higher than 0V, the threshold voltage directly under the control gate electrode is not varied from a predetermined threshold voltage designed by a designer. Therefore, a total characteristic of the split-gate memory cell is not the depletion transistor characteristic.

The split-gate memory cell is disclosed, for example, in Japanese Unexamined Patent Publication (JP-A) No. 293566/1996 related to a semiconductor device, a method of manufacturing the semiconductor device, a split-gate transistor, a method of manufacturing the split-gate transistor, and a nonvolatile semiconductor memory.

Generally, the split-gate memory cell is arranged in a memory cell array having a layout in which word lines and bit lines perpendicularly intersect each other so that a specific memory cell can be selected as desired. In a manufacturing process, aluminum wiring patterns as the bit lines are arranged to perpendicularly intersect control gate electrode polysilicon patterns as the word lines. Therefore, it is necessary to form a contact hole for electrical connection between the source/drain diffusion layer of each memory cell and each aluminum wiring pattern. This means that a memory cell area occupied by the memory cell is increased because an extra area is required for the contact hole. It is therefore difficult to reduce the memory cell area.

In order to avoid the above-mentioned problem, it is proposed to use the source/drain diffusion layer as the bit lines. However, the source/drain diffusion layer required to perpendicularly intersect the control gate electrode polysilicon pattern is generally formed prior to formation of the gate electrode. Therefore, the source/drain diffusion layer is not arranged to be self-aligned with respect to the control gate electrode polysilicon pattern. As a result, the memory cell characteristic widely fluctuates in dependence upon the accuracy in pattern arrangement.

SUMMARY OF THE INVENTION

It is an object of this invention to provide a method of manufacturing a split-gate flash memory cell which is capable of substantially reducing a memory cell area occupied by the memory cell and which is capable of suppressing fluctuation in memory cell characteristic.

According to this invention, there is provided a method of manufacturing a split-gate flash memory cell comprising source and drain diffusion regions, a floating gate insulation film, a floating gate electrode, a control gate insulation film, and a control gate electrode, the method comprising: a first step of successively forming the floating gate insulation film and the floating gate electrode on a selected area of a semiconductor substrate; a second step of forming the control gate insulation film on the floating gate electrode and on a remaining area of the semiconductor substrate, the control gate insulation film having a side wall part brought into contact with a side wall of the floating gate electrode; a third step of carrying out ion-implantation of a first dopant to form the source diffusion region on a first part of the remaining area of the semiconductor substrate; a fourth step of forming a sidewall electrode brought into contact with the sidewall part of the control gate insulation film; a fifth step of carrying out ion-implantation of a second dopant to form, on a second part of the remaining area of the semiconductor substrate, the drain diffusion region self-aligned with respect to the sidewall electrode; and a sixth step of forming the control gate electrode on the control gate insulation film and on the sidewall electrode.

DESCRIPTION OF THE PREFERRED EMBODIMENT

In order to facilitate an understanding of this invention, a conventional method of manufacturing a split-gate flash memory cell will at first be described with reference to FIGS. 1A through 1D.

Figure 1A:
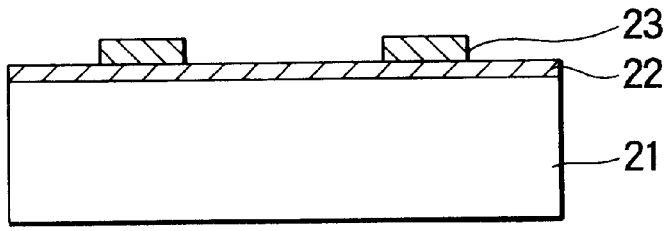
FIGS. 1A through 1D are side sectional views for describing a conventional method of manufacturing a split-gate flash memory cell and correspond to a floating gate electrode polysilicon pattern forming step, a photoresist pattern forming step, a source diffusion layer forming step, and a bit-line aluminum wiring pattern forming step, respectively.

Referring to FIG. 1A, a floating gate electrode polysilicon pattern forming step will be described. On a silicon substrate 21 with an insulation film (not shown) for device isolation formed thereon, a tunnel gate oxide film 22 is formed by thermal oxidation to a thickness of 100 angstroms. On the tunnel gate oxide film 22, a floating gate electrode polysilicon thin film 23 is formed by CVD (Chemical Vapor Deposition) to a thickness of 1500 angstroms. Thereafter, the floating gate electrode polysilicon thin film 23 is patterned by photolithography and polysilicon dry etching to obtain a floating gate electrode polysilicon pattern.

Figure 1B:
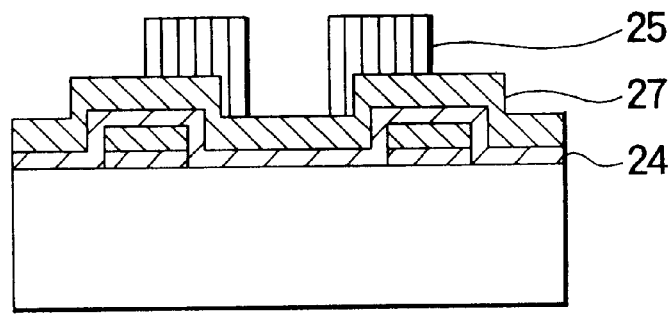

Next referring to FIG. 1B, a photoresist pattern forming step will be described. The tunnel gate oxide film 22 is removed except a part under the floating gate electrode polysilicon thin film 23 by a known selective etching technique. On the tunnel gate oxide film 22 and the floating gate electrode polysilicon thin film 23 formed on the silicon substrate 21, a silicon oxide film 24 as an insulation film and a control gate electrode polysilicon film 27 are successively formed to thicknesses of 100 angstroms and 1500 angstroms, respectively. Thereafter, a stripe-shaped photoresist pattern 25 of a thickness of 1 micron is formed to cover a part of the floating gate electrode polysilicon film 23 as well as a part of an area without the floating gate electrode polysilicon film 23.

Figure 1C:
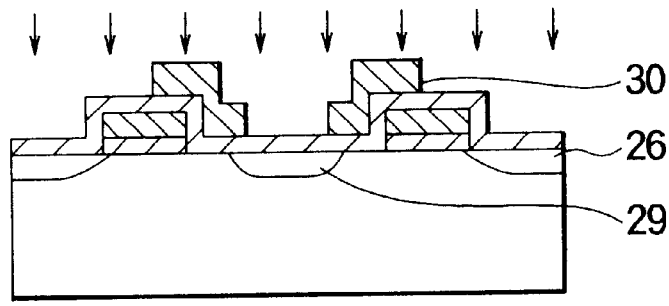

Turning to FIG. 1C, a source diffusion layer forming step will be described. With the photoresist pattern 25 used as a mask, the control gate electrode polysilicon film 27 is patterned by dry etching into a stripe pattern to form a control gate electrode polysilicon pattern 30. Then, after the photoresist pattern 25 is removed, arsenic (As) is implanted as a dopant to form source and drain diffusion layers 26 and 29.

Figure 1D:
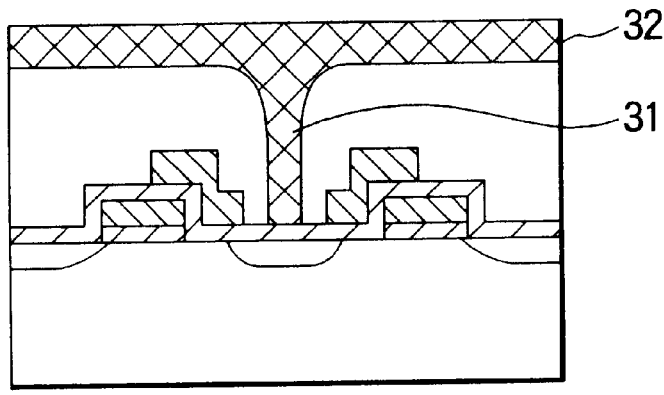

Referring to FIG. 1D, a bit-line aluminum wiring pattern forming step will be described. An insulation film is formed on an overall surface to cover those patterns formed on the silicon substrate 21. A contact hole 31 is formed in the insulation film to lead to the drain diffusion layer 29 of the memory cell. Thereafter, a bit-line aluminum wiring pattern 32 of a thickness of 5000 angstroms is formed to perpendicularly intersect the control gate electrode polysilicon pattern 30 of a strip shape which finally serves as word lines of a memory cell array.

Generally, the split-gate memory cell is arranged in the memory cell array having a layout in which the word lines and bit lines perpendicularly intersect each other so that a specific memory cell can be selected as desired. In a manufacturing process, the aluminum wiring patterns as the bit lines are arranged to perpendicularly intersect the control gate electrode polysilicon patterns as the word lines. Therefore, it is necessary to form a contact hole for electrical connection between the drain diffusion layer of each memory cell and each aluminum wiring pattern. This means that a memory cell area occupied by the memory cell is increased because an extra area is required for the contact hole. It is therefore difficult to reduce the memory cell area.

In order to avoid the above-mentioned problem, it is proposed to use the drain diffusion layer 29 as the bit lines. However, the drain diffusion layer 29 required to perpendicularly intersect the control gate electrode polysilicon pattern 30 is generally formed prior to formation of the gate electrode. Therefore, the drain diffusion layer 29 is not arranged to be self-aligned with respect to the control gate electrode polysilicon pattern 30. As a result, the memory cell characteristic widely fluctuates in dependence upon the accuracy in pattern arrangement.

Description will now be made as regards a method of manufacturing a split-gate flash memory cell according to one embodiment this invention with reference to FIGS. 2A through 2E. In this embodiment, a semiconductor film, a gate oxide film, an insulation film, and a semiconductor substrate comprise a silicon film, a silicon oxide film, a silicon oxide film, and a silicon substrate, respectively.

Figure 2A:
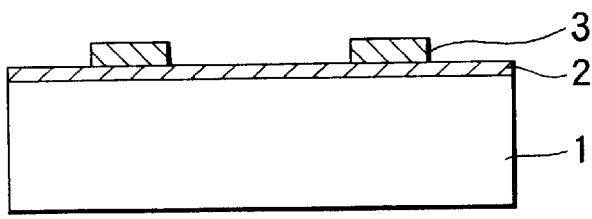
FIGS. 2A through 2E are side sectional views for describing a method of manufacturing a split-gate flash memory cell according to one embodiment of this invention and correspond to a floating gate electrode polysilicon pattern forming step, a first diffusion layer forming step, a sidewall polysilicon film forming step, and a second diffusion layer forming step, and a control gate electrode polysilicon film forming step, respectively.

At first referring to FIG. 2A, a floating gate electrode polysilicon pattern forming step will be described. A silicon substrate 1 is provided with a device isolation region formed by LOCOS (Local Oxidation of Silicon) separation. On the silicon substrate 1, a tunnel gate oxide film 2 is formed by thermal oxidation in a device region to a thickness of 100 angstroms. Thereafter, a floating gate electrode polysilicon film 3 is formed by CVD to a thickness of 2000 angstroms. Then, the floating gate electrode polysilicon film 3 is patterned by photolithography and polysilicon dry etching into a stripe pattern to obtain a floating gate electrode polysilicon pattern.

Figure 2B:
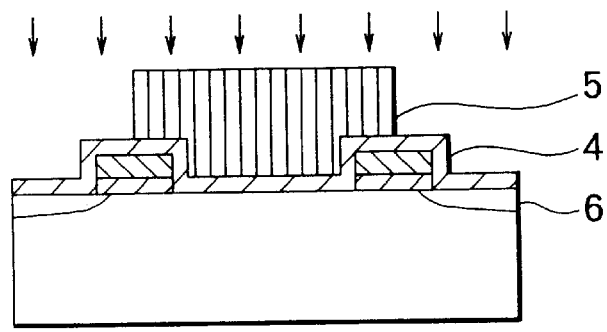

Next referring to FIG. 2B, a first diffusion layer forming step will be described. The tunnel gate oxide film 2 is removed except a part under the floating gate electrode polysilicon film 3 by a known selective etching technique. As an insulation film between a floating gate electrode and a control gate electrode on the silicon substrate 1 and as a gate insulation film in a split gate area, a silicon oxide film 4 of a thickness of 180 angstroms is formed by thermal oxidation. Then, a photoresist pattern 5 is formed on a drain diffusion layer region and a part of the floating gate electrode polysilicon film 3 adjacent thereto. With the photoresist pattern 5 used as a mask, arsenic ion implantation is carried out to form a source diffusion layer 6.

Figure 2C:
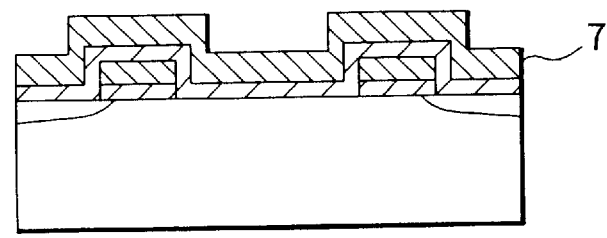

Referring to FIG. 2C, a sidewall polysilicon thin film forming step will be described. After the photoresist pattern 5 is removed, a polysilicon film 7 is deposited to a thickness of 2000 angstroms and subjected to anisotropic dry etching. Thus, a sidewall polysilicon thin film 8 is formed on a sidewall of the floating gate electrode polysilicon film 3.

Figure 2D:
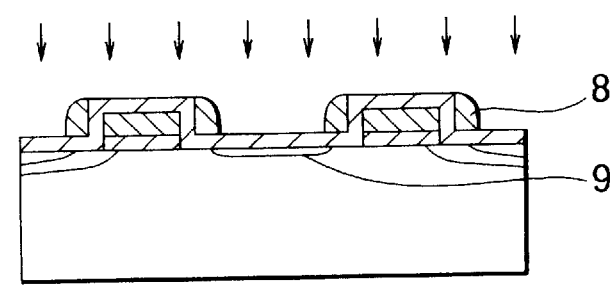

Referring to FIG. 2D, a second diffusion layer forming step will be described. With the floating gate electrode polysilicon film 3 and the sidewall polysilicon thin film 8 used as a mask, arsenic ion implantation is carried out to form a drain diffusion layer 9.

Figure 2E:
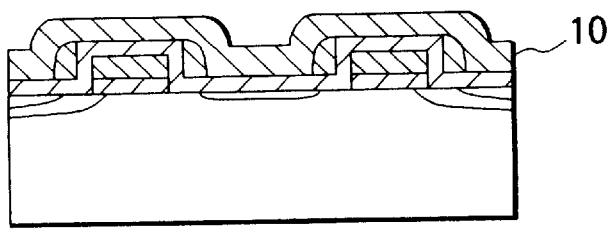

Referring to FIG. 2E, a control gate electrode polysilicon film forming step will be described. A control gate electrode polysilicon film 10 is formed on the silicon substrate 1 to be electrically connected to the sidewall polysilicon thin film 8.

Furthermore, as a control gate electrode pattern forming step, the control gate electrode polysilicon film 10 and the sidewall polysilicon thin film 8 are patterned by photolithography and polysilicon dry etching into a stripe pattern perpendicular to the floating gate electrode polysilicon film 3 to obtain a control gate electrode pattern which serves as word lines.

Finally, as a floating gate electrode forming step, the silicon oxide film 4 and the floating gate electrode polysilicon film 3 are subjected to silicon-oxide dry etching and polysilicon dry etching, respectively, with the control gate electrode pattern used as a mask. Thus, the floating gate electrode polysilicon film 3 is patterned to obtain a floating gate electrode.

With the above-mentioned method, the drain diffusion layer 9 is used as the bit lines so that no contact hole leading to the drain electrode of the memory cell is required. Therefore, a memory cell area occupied by the memory cell is reduced. In addition, the source diffusion layer 6 and the drain diffusion layer 9 are formed to be self-aligned with respect to the floating gate electrode polysilicon pattern. This makes it possible to suppress fluctuation in memory cell characteristic.

In the foregoing embodiment, the source diffusion layer 6 and the drain diffusion layer 9 may be reversed.

In case where the source diffusion layer 6 and the drain diffusion layer 9 are reversed, the above-mentioned process is modified in the following manner. Specifically, in the first diffusion layer forming step, ion implantation is carried out to form the drain diffusion layer 9 with a source diffusion layer region on the silicon substrate 1 masked by the photoresist pattern 5. In the second diffusion layer forming step, ion implantation is carried out to form the source diffusion layer 6 with the floating gate electrode polysilicon film 3 and the sidewall polysilicon thin film 8 used as a mask.

By the use of the above-mentioned method, simultaneously when the source diffusion layer 6 and the drain diffusion layer 9 or the source/drain diffusion layer in the memory cell are formed to be self-aligned with respect to the floating gate and the sidewall polysilicon thin film 8 as the control gate electrode in a split region, the diffusion layer wiring patterns as the source lines and the bit lines perpendicular to the control gate pattern as the word line are formed. Therefore, no contact hole is required to connect the bit lines and the drain diffusion layer. Therefore, it is possible to substantially reduce the memory cell area occupied by the memory cell and to suppress fluctuation in memory cell characteristic.

What is claimed is:

1. A method of manufacturing a split-gate flash memory cell comprising source and drain diffusion regions (6 and 9), a floating gate insulation film (2), a floating gate electrode (3), a control gate insulation film (4), and a control gate electrode (10), said method comprising:

a first step of successively forming said floating gate insulation film (2) and said floating gate electrode (3) on a selected area of a semiconductor substrate (1);

a second step of forming said control gate insulation film (4) on said floating gate electrode (3) and on a remaining area of said semiconductor substrate (1), said control gate insulation film (4) having a side wall part brought into contact with a side wall of said floating gate electrode (3);

a third step of carrying out ion-implantation of a first dopant to form said source diffusion region (6) on a first part of said remaining area of the semiconductor substrate (1);

a fourth step of forming a sidewall electrode (8) brought into contact with said sidewall part of the control gate insulation film (4);

a fifth step of carrying out ion-implantation of a second dopant to form, on a second part of said remaining area of the semiconductor substrate (1), said drain diffusion region (9) self-aligned with respect to said sidewall electrode (8); and a sixth step of forming said control gate electrode (10) on said control gate insulation film (4) and on said sidewall electrode (8).

2. A method as claimed in claim 1, wherein each of said floating gate electrode (3), said sidewall electrode (8), said control gate electrode (10) is of a polysilicon film.

3. A method as claimed in claim 1, wherein said first step comprises the steps of:

forming said floating gate insulation film (2) on said semiconductor substrate (1);

selectively forming said floating gate electrode (3) on said gate insulation film (2); and removing said floating gate insulation film (2) except a part under said floating gate electrode (3).

4. A method as claimed in claim 1, wherein said third step comprises the step of:

carrying out ion-implantation of said first dopant to form said source diffusion region (6) on said first part of the remaining area of said semiconductor substrate (1) with said second part of the remaining area of said semiconductor substrate (1) masked by a photoresist pattern (5).

5. A method as claimed in claim 1, wherein said fourth step comprises the steps of:

depositing a polysilicon film (7) on said control gate insulation film (4); and anisotropic-etching said polysilicon film (7) so that a portion of said polysilicon film (7) brought into contact with said sidewall part of the control gate insulation film (4) remains as said sidewall electrode (8).

6. A method as claimed in claim 1, wherein said fifth step comprises the step of:

carrying out ion-implantation of said second dopant to form said drain diffusion region (9) on said second part of the remaining area of said semiconductor substrate (1) with said sidewall electrode (8) used as a part of a mask.

7. A method of manufacturing a split-gate flash memory cell comprising source and drain diffusion regions, a floating gate insulation film (2), a floating gate electrode (3), a control gate insulation film (4), and a control gate electrode (10), said method comprising:

a first step of successively forming said floating gate insulation film (2) and said floating gate electrode (3) on a selected area of a semiconductor substrate (1);

a second step of forming said control gate insulation film (4) on said floating gate electrode (3) and on a remaining area of said semiconductor substrate (1), said control gate insulation film (4) having a side wall part brought into contact with a side wall of said floating gate electrode (3);

a third step of carrying out ion-implantation of a first dopant to form one of said source and said drain diffusion regions on a first part of said remaining area of the semiconductor substrate (1);

a fourth step of forming a sidewall electrode (8) brought into contact with said sidewall part of the control gate insulation film (4);

a fifth step of carrying out ion-implantation of a second dopant to form, on a second part of said remaining area of the semiconductor substrate (1), a different one of said source and said drain diffusion regions that is self-aligned with respect to said sidewall electrode (8); and a sixth step of forming said control gate electrode (10) on said control gate insulation film (4) and on said sidewall electrode (8).

8. A method as claimed in claim 7, wherein each of said floating gate electrode (3), said sidewall electrode (8), said control gate electrode (10) is of a polysilicon film.

9. A method as claimed in claim 7, wherein said first step comprises the steps of:

forming said floating gate insulation film (2) on said semiconductor substrate (1);

selectively forming said floating gate electrode (3) on said gate insulation film (2); and removing said floating gate insulation film (2) except a part under said floating gate electrode (3).

10. A method as claimed in claim 7, wherein said third step comprises the step of:

carrying out ion-implantation of said first dopant to form said one of the source and the drain diffusion regions on said first part of the remaining area of said semiconductor substrate (1) with said second part of the remaining area of said semiconductor substrate (1) masked by a photoresist pattern (5).

11. A method as claimed in claim 7, wherein said fourth step comprises the steps of:

depositing a polysilicon film (7) on said control gate insulation film (4); and anisotropic-etching said polysilicon film (7) so that a portion of said polysilicon film (7) brought into contact with said sidewall part of the control gate insulation film (4) remains as said sidewall electrode (8).

12. A method as claimed in claim 7, wherein said fifth step comprises the step of:

carrying out ion-implantation of said second dopant to form said different one of the source and the drain diffusion regions on said second part of the remaining area of said semiconductor substrate (1) with said sidewall electrode (8) used as a part of a mask.

* * * * *